US012693598B2

(12) United States Patent
Choi et al.

(10) Patent No.: US 12,693,598 B2
(45) Date of Patent: Jul. 28, 2026

(54) APPARATUS AND METHOD FOR PROCESSING SUBSTRATE

(71) Applicant: SEMES CO., LTD., Chungcheongnam-do (KR)

(72) Inventors: Hae Won Choi, Daejeon (KR); Joon Ho Won, Gyeonggi-do (KR); Koriakin Anton, Chungcheongnam-do (KR); Ki Hoon Choi, Chungcheongnam-do (KR); Eung Su Kim, Gyeonggi-do (KR); Pil Kyun Heo, Gyeonggi-do (KR); Min Woo Kim, Seoul (KR); Jin Yeong Sung, Gyeonggi-do (KR); Hyo Soo Kim, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 1063 days.

(21) Appl. No.: 17/732,565

(22) Filed: Apr. 29, 2022

(65) Prior Publication Data

US 2023/0350304 A1 Nov. 2, 2023

(51) Int. Cl.
*G03F 7/30* (2006.01)
*G03F 7/32* (2006.01)

(52) U.S. Cl.
CPC ............ *G03F 7/3021* (2013.01); *G03F 7/327* (2013.01)

(58) Field of Classification Search
CPC ............................... G03F 7/3021; G03F 7/327
See application file for complete search history.

(56) References Cited

U.S. PATENT DOCUMENTS 6,548,228 B2 4/2003 Mutoh
8,728,247 B2 5/2014 Inatomi
(Continued)

FOREIGN PATENT DOCUMENTS

CN 110297402 A 10/2019
CN 110739203 A 1/2020
(Continued)

OTHER PUBLICATIONS

Office Action dated Oct. 23, 2023 for Korean Patent Application No. 10-2020-0162003 and its English translation from Global Dossier.
(Continued)

*Primary Examiner* — Jonathan Johnson
*Assistant Examiner* — Jayson D Cosgrove
(74) *Attorney, Agent, or Firm* — WOMBLE BOND DICKINSON (US) LLP

(57) ABSTRACT

There are provided an apparatus and a method for providing a substrate, which can suppress any additional reaction between a developing solution and a photoresist (PR) film and prevent any PR remnants from being generated from such additional reaction. The method includes: supplying an organic developing solution onto a substrate while rotating the substrate at a first revolutions per minute (rpm); substituting the organic developing solution with a nonpolar rinse solution by supplying the nonpolar rinse solution onto the substrate while rotating the substrate at a second rpm, which is lower than the first rpm; continuing to supply the nonpolar rinse solution while rotating the substrate at a third rpm, which is higher than the second rpm; and continuing to supply the nonpolar rinse solution while rotating the substrate at a fourth rpm, which is between the second rpm and the third rpm.

11 Claims, 10 Drawing Sheets

(56)                  References Cited

U.S. PATENT DOCUMENTS

| | | | |
|---|---|---|---|
| 9,847,239 B2 | 12/2017 | Inatomi | |
| 10,539,877 B2 | 1/2020 | Harumoto et al. | |
| 10,915,026 B2 | 2/2021 | Choi et al. | |
| 2013/0194557 A1* | 8/2013 | Yamamoto | G03F 7/3021 |
| | | | 355/27 |
| 2017/0102616 A1* | 4/2017 | Hashimoto | G03F 7/3021 |
| 2019/0258168 A1* | 8/2019 | Kamimura | C08F 212/24 |
| 2019/0294049 A1* | 9/2019 | Harumoto | G03F 7/3021 |
| 2020/0026194 A1 | 1/2020 | Choi et al. | |

FOREIGN PATENT DOCUMENTS

| | | |
|---|---|---|
| JP | 8-321464 | 12/1996 |
| JP | 2001-217181 | 8/2001 |
| JP | 2004-22764 | 1/2004 |
| JP | 2015-14726 | 1/2015 |
| KR | 10-2009-0101816 | 9/2009 |
| KR | 10-2011-0074681 | 7/2011 |
| KR | 10-1523539 | 5/2015 |
| KR | 10-1829471 | 2/2018 |
| KR | 10-2019-0000951 | 1/2019 |
| KR | 10-2037906 | 11/2019 |
| KR | 10-2020-0009841 | 1/2020 |
| WO | 2015/002250 A1 | 1/2015 |
| WO | 2022/054721 | 3/2022 |

OTHER PUBLICATIONS

Office Action dated Apr. 7, 2023 for Korean Patent Application No. 10-2020-0162003 and its English translation from Global Dossier.
Office Action dated Apr. 18, 2023 for Japanese Patent Application No. 2022-066139 and its English translation by Google Translate.
Office Action dated May 14, 2026 for Chinese Patent Application No. 202210485089.X and its English translation provided by Applicant's foreign counsel/Google Translate.

* cited by examiner

APPARATUS AND METHOD FOR PROCESSING SUBSTRATE

BACKGROUND

1. Field

The present disclosure relates to an apparatus and method for processing a substrate.

2. Description of the Related Art

During the fabrication of a semiconductor or display device, various processes such as photolithography, etching, ashing, ion implantation, thin-film deposition, and rinsing are performed. Here, photolithography may include application, exposure, and development processes. Specifically, during the application process, a photosensitive liquid is applied onto a substrate, during the exposure process, circuit patterns on the substrate with the photosensitive liquid formed thereon are exposed to light, and during the development process, parts of the substrate that are exposed are selectively developed with a developing solution. Thereafter, the developing solution is removed, and the substrate is dried.

SUMMARY

Aspects of the present disclosure provide an apparatus and method for processing a substrate, which are capable of suppressing any additional reaction between a developing solution and a photoresist (PR) film and preventing any PR remnants from being generated from such additional reaction.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of processing a substrate, comprising supplying an organic developing solution onto a substrate while rotating the substrate at a first revolutions per minute (rpm); substituting the organic developing solution with a nonpolar rinse solution by supplying the nonpolar rinse solution onto the substrate while rotating the substrate at a second rpm, which is lower than the first rpm; supplying the nonpolar rinse solution while rotating the substrate at a third rpm, which is higher than the second rpm; and rotating the substrate at a fourth rpm, which is between the second rpm and the third rpm.

According to another aspect of the present disclosure, there is provided a, a method of processing a substrate, comprising a first step of supplying an organic developing solution onto a substrate with an exposed photoresist (PR) film formed thereon, while rotating the substrate at a first revolutions per minute (rpm); a second step of reducing a rotation speed of the substrate from the first rpm to a second rpm, which is lower than the first rpm; and a third step of removing PR reactants, generated from a reaction with the organic developing solution, by raising the rotation speed of the substrate from the second rpm to a third rpm, which is higher than the second rpm, wherein in the second or third step, the organic developing solution is substituted with a rinse solution by supplying the rinse solution onto the substrate According to still another aspect of the present disclosure, there is provided an apparatus for processing a substrate, comprising a first processing chamber supplying an organic developing solution onto a first substrate; a second processing chamber processing the first substrate with a supercritical fluid; a first transfer robot transferring the first substrate with the organic developing solution remained thereon from the first processing chamber to the second processing chamber; a third processing chamber supplying the organic developing solution onto the second substrate and substituting the organic developing solution on the second substrate with a nonpolar rinse solution; a fourth processing chamber processing the second substrate with the supercritical fluid; and a second transfer robot transferring the second substrate with the nonpolar rinse solution remained thereon from the third processing chamber to the fourth processing chamber, wherein a first amount of the organic developing solution on the first substrate is greater than a second amount of the nonpolar rinse solution on the second substrate.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
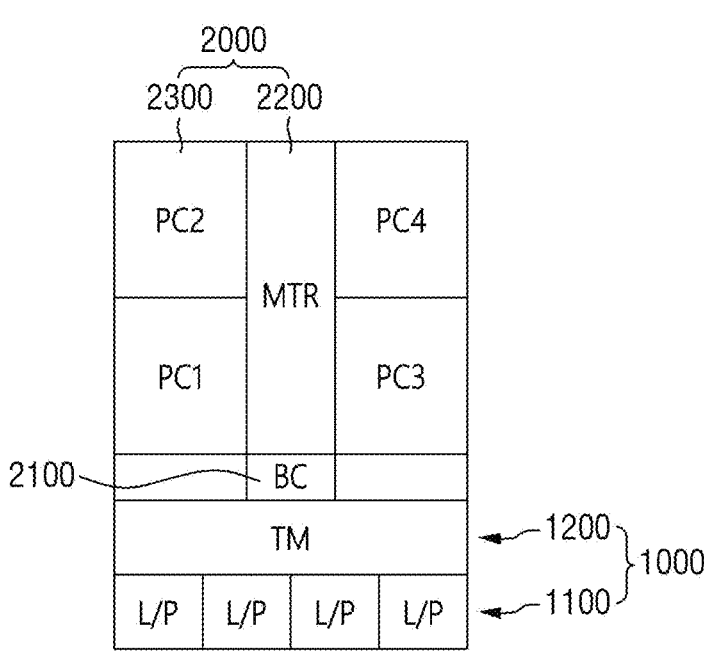
FIG. 1 is a plan view of an apparatus for processing a substrate according to some embodiments of the present disclosure.

Embodiments of the present disclosure will hereinafter be described with reference to the accompanying drawings. Advantages and features of the present disclosure and a method of achieving the same should become clear with embodiments described in detail below with reference to the accompanying drawings. However, the present disclosure is not limited to the embodiments disclosed below and may be realized in various other forms. The present embodiments make the disclosure complete and are provided to completely inform one of ordinary skill in the art to which the present disclosure pertains of the scope of the disclosure. The present disclosure is defined only by the scope of the claims. Like reference numerals refer to like elements throughout.

Spatially-relative terms such as "below", "beneath", "lower", "above" or "upper" may be used herein to describe one element's relationship to another element as illustrated in the accompanying drawings. It will be understood that spatially-relative terms are intended to encompass different orientations of the device in addition to the orientation depicted in the drawings. For example, if the device in one of the drawings is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users.

Embodiments of the present disclosure will hereinafter be described with reference to the accompanying drawings. Like reference numerals indicate like elements through the present disclosure, and thus, detailed descriptions thereof will be omitted.

FIG. 1 is a plan view of an apparatus (hereinafter, "the apparatus") for processing a substrate according to some embodiments of the present disclosure.

Referring to FIG. 1, a substrate with an exposed photoresist (PR) film formed thereon is transferred into the apparatus, and a development process using a developing solution and a drying process using a supercritical fluid are performed in the apparatus.

The apparatus includes an index module 1000 and a processing module 2000.

The index module 1000 receives a substrate W from the outside and delivers the substrate W to the processing module 2000. The substrate W may have an exposed PR film formed thereon. For example, the PR film may be obtained by negative-tone development (NTD) or positive-tone development (PTD) and may be a chemically amplified resist (CAR) film or a non-CAR film.

The index module 1000 may be an equipment front end module (EFEM) and includes load ports ("L/P") 1100 and a transfer frame ("TM") 1200.

A container C where the substrate W is accommodated is placed in the load ports 1100. A front opening unified pod (FOUP) may be used as the container C. The container C may be brought in or out of the load ports 1100 by an overhead transfer (OHT).

The transfer frame 1200 transfers the substrate W between the container C in the load ports 1100 and the processing module 2000. The transfer frame 1200 may include an index robot moving on an index rail.

The processing module 2000 includes a buffer chamber ("BC") 2100, a transfer chamber ("MTR") 2200, and a plurality of processing chambers 2300.

The buffer chamber 2100 provides space in which the substrate W temporarily stays while being transferred between the index module 1000 and the processing module 2000. A s plurality of buffer slots may be disposed in the buffer chamber 2100. For example, the index robot of the transfer frame 1200 may retrieve the substrate W from the container C and may place the substrate W in the buffer slots.

A transfer robot of the transfer chamber 2200 may retrieve the substrate W in the buffer slots and may then transfer the substrate W to a particular processing chamber 2300, for example, to a first processing chamber PC1. Also, the transfer robot of the transfer chamber 2200 may transfer the substrate W from one processing chamber to another processing chamber 2300, for example, from the first processing chamber PC1 to a second processing chamber PC2.

The processing chambers 2300 may be arranged in a row and/or stacked vertically. The processing chambers 2300 may be disposed on both sides of the transfer chamber 2200. The layout of the processing chambers 2300 Is not particularly limited, but may vary in consideration of the footprint and the processing efficiency of the apparatus.

In one of the processing chambers 2300, for example, in the first processing chamber PC1, the substrate W is developed with an organic developing solution (e.g., n-butyl acetate), for example, in the first processing chamber PC1, and the organic developing solution is substituted with a nonpolar rinse solution (e.g., decane). Thereafter, the nonpolar rinse solution is removed by a supercritical fluid, in another processing chamber 2300, for example, in the second processing chamber PC1. This will be described later with reference to FIGS. 5 through 10.

Figure 2:
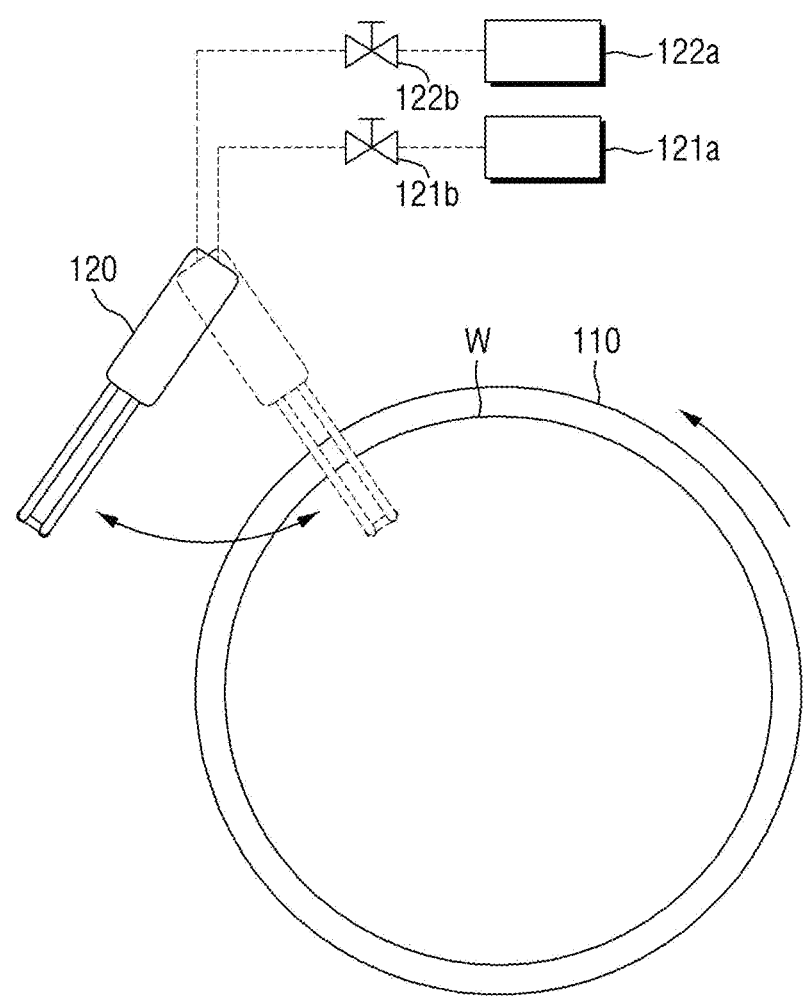
FIG. 2 is a schematic view of an exemplary processing chamber of FIG. 1.
Figure 3:
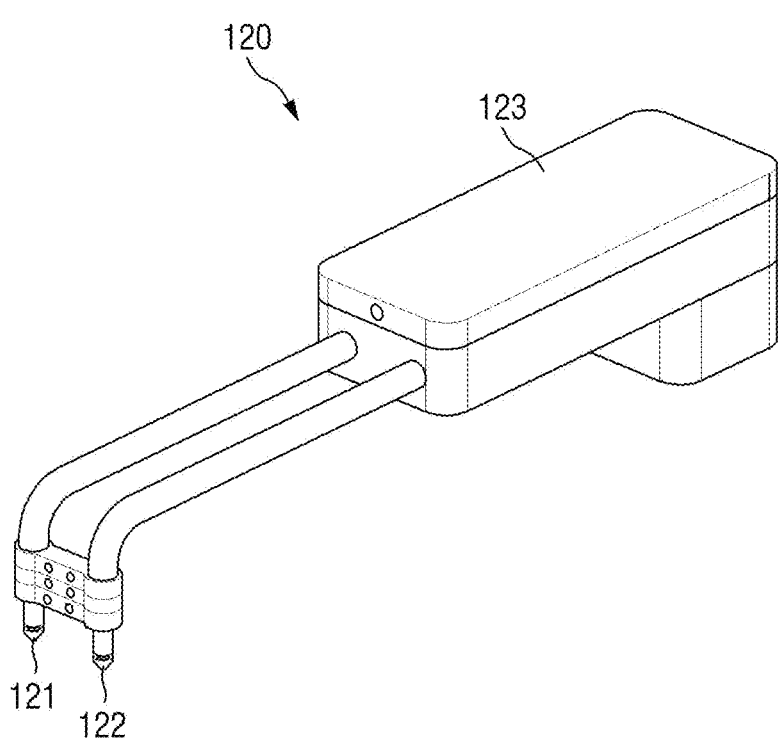
FIG. 3 is a perspective view of a nozzle structure of FIG. 2.

FIG. 2 is a schematic view of an exemplary processing chamber of FIG. 1. FIG. 3 is a perspective view of a nozzle structure of FIG. 2.

Referring to FIGS. 2 and 3, a support unit 110, which supports the substrate W, is disposed in a processing chamber 2300, for example, in the first processing chamber PC1. The s support unit 110 may rotate the substrate W at a predetermined speed (or revolutions per minute (rpm)).

A first nozzle structure 120, which is for supplying an organic developing solution and a nonpolar rinse solution onto the substrate W, is positioned near the support unit 110.

The organic developing solution may be n-butyl acetate, but the present disclosure is not limited thereto. The type of the organic developing solution is not particularly limited as long as it is capable of developing a negative PR film.

The nonpolar rinse solution may be at least one alkane solvent selected from among nonane, decane, undecane, and dodecane, but the present disclosure is not limited thereto. The nonpolar rinse solution may be easily substitutable with the organic developing solution. The type of the nonpolar rinse solution is not particularly limited as long as it does not react with a negative PR film.

The first nozzle structure 120 may rotate, for example, between a supply location and a standby location. When placed at the supply location, the first nozzle structure 120 may supply the organic developing solution and/or the nonpolar rinse solution onto the substrate W. For example, the first nozzle structure 120 may be placed at the standby location while the substrate W is being brought in or out of the first processing chamber PC1.

The first nozzle structure 120 may include an arm 123, a first nozzle 121, which supplies the organic developing solution, and a second nozzle 122, which supplies the nonpolar rinse solution. As the first and second nozzles 121 and 122 are formed in a single nozzle structure, i.e., the first nozzle structure 120, the organic developing solution and the nonpolar rinse solution can be supplied in series onto the substrate W.

The first nozzle 121 is fluidly connected to a first storage 121*a*, which stores the organic developing solution. A first valve 121*b* may be disposed between the first nozzle 121 and the first storage 121*a* and may be turned on or off under the control of a controller (not illustrated). The second nozzle 122 is fluidly connected to a second storage 122*a*, which stores the nonpolar rinse solution. A second valve 122*b* may be disposed between the second nozzle 122 and the second storage 122*a* and may be turned on or off under the control of the controller.

Figure 4:
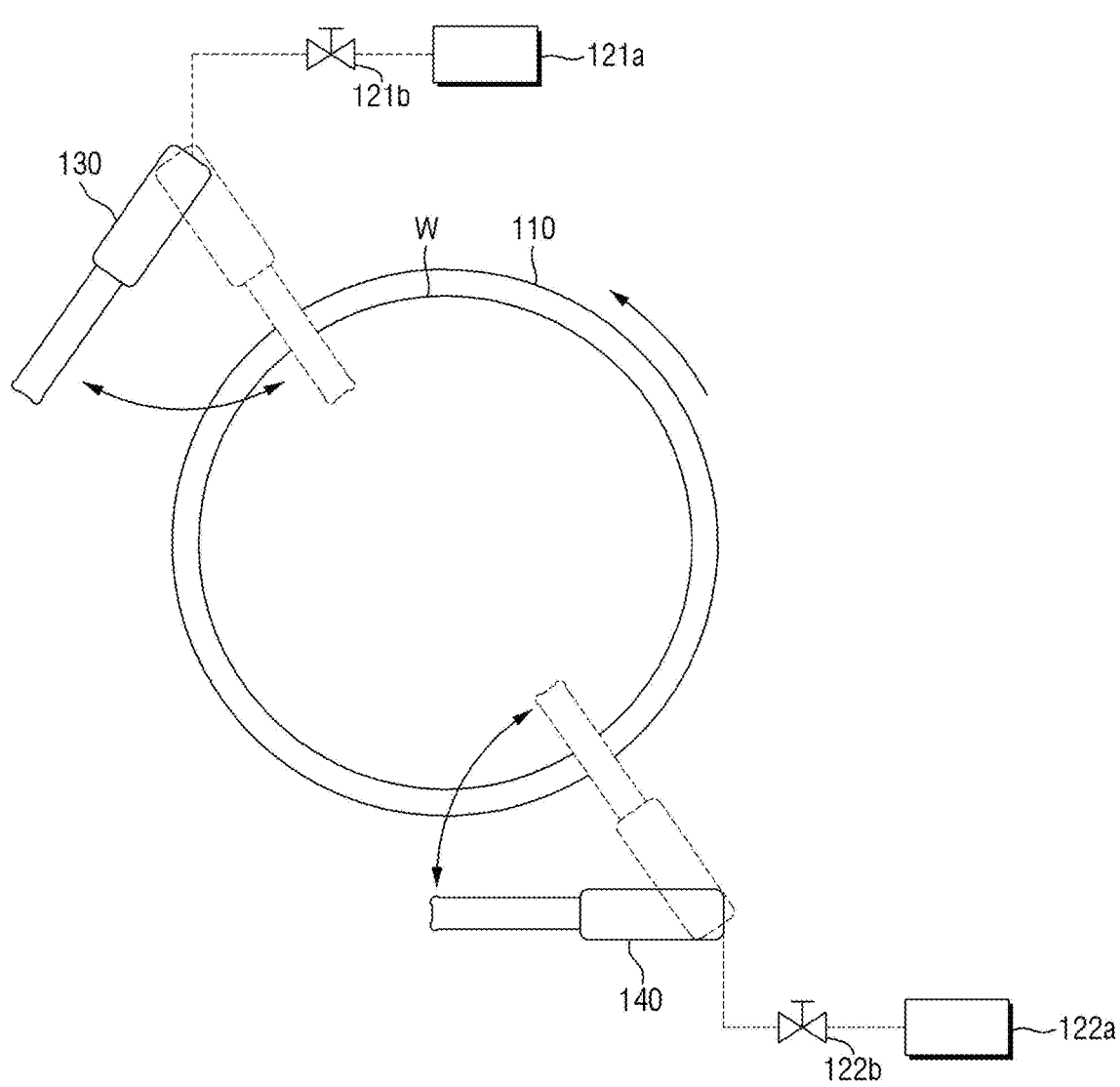
FIG. 4 is a schematic view of another exemplary processing chamber of FIG. 1.

FIG. 4 is a schematic view of another exemplary processing chamber of FIG. 1. For convenience, the processing chamber of FIG. 4 will hereinafter be described, focusing mainly on the differences with the processing chamber of FIGS. 2 and 3.

Referring to FIG. 3, the organic developing solution and the nonpolar rinse solution are supplied by a single nozzle structure, i.e., the first nozzle structure 120. On the contrary, referring to FIG. 4, separate nozzle structures, i.e., a second nozzle structure 130 for supplying the organic developing solution and a third nozzle structure 140 for supplying the nonpolar rinse solution, are provided.

A support unit 110, which supports the substrate W, is disposed in a processing chamber 2300, for example, in the first processing chamber PC1. The support unit 110 may rotate the substrate W at a predetermined speed (or rpm).

The second nozzle structure 130 may be rotatable and may supply the organic developing solution onto the substrate W. The second nozzle structure 130 is fluidly connected to a first storage 121*a*, which stores the organic developing solution. A first valve 121*b* may be disposed between the second nozzle structure 130 and the first storage 121*a* and may be turned on or off under the control of a controller (not illustrated).

The third nozzle structure 140 may be rotatable and may supply the nonpolar rinse solution onto the substrate W. The third nozzle structure 140 is fluidly connected to a second storage 122*a*, which stores the nonpolar rinse solution. A second valve 122*b* may be disposed between the third nozzle structure 140 and the second storage 122*a* and may be turned on or off under the control of the controller.

Figure 5:
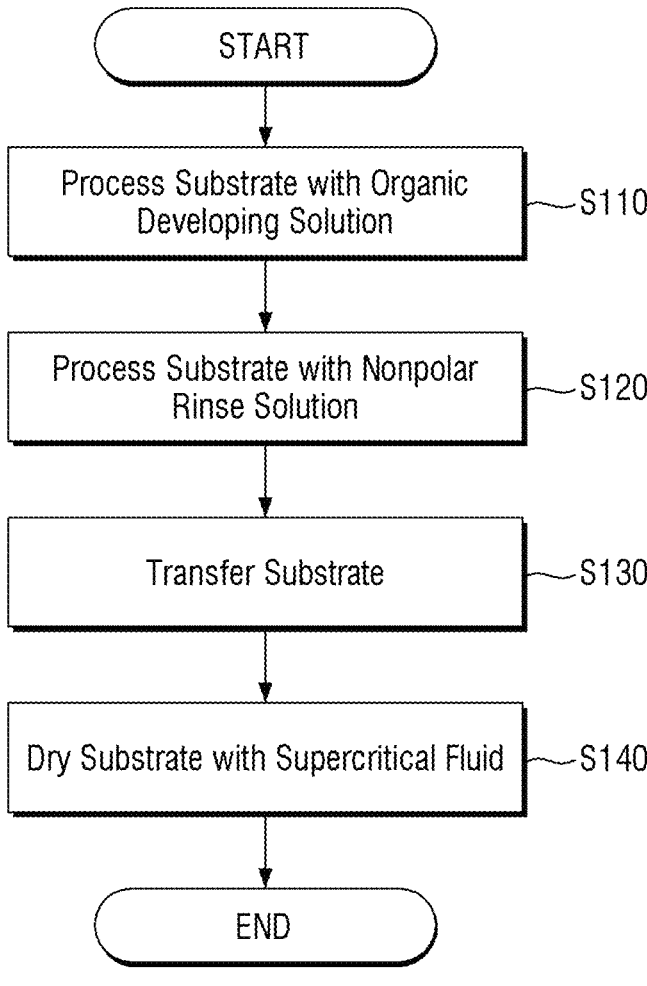
FIG. 5 is a flowchart illustrating a method of processing a substrate according to some embodiments of the present disclosure.

FIG. 5 is a flowchart illustrating a method of processing a substrate according to some embodiments of the present disclosure.

Referring to FIG. 5, a substrate W with an exposed PR film formed thereon is brought in a processing chamber, for example, in the first processing chamber PC1 of FIG. 1. Here, the PR film may be a CAR film obtained by NTD.

Thereafter, the substrate W is processed with an organic developing solution, in the processing chamber (S110).

Specifically, the organic developing solution, for example, n-butyl acetate, is supplied onto the substrate W. The exposed PR film is developed with the organic developing solution. As a negative PR film is used as the exposed PR film, parts of the exposed PR film that are not exposed to light during exposure react with the organic developing solution and are thus dissolved.

Thereafter, the substrate W is processed with a nonpolar rinse solution, in the first processing chamber PC1 (S120).

Specifically, the nonpolar rinse solution may be at least one alkane solvent selected from among nonane, decane, undecane, and dodecane. As the organic developing solution is substituted with the nonpolar rinse solution, development does not occur any longer because the nonpolar rinse solution does not react with a PR film.

Thereafter, the substrate W is transferred, for example, from the first processing chamber PC1 to the second processing chamber PC2 (S130).

Specifically, the transfer robot of the transfer chamber 2200 moves the substrate W with the nonpolar rinse solution remained thereon from the first processing chamber PC1 to the second processing chamber PC2. As the nonpolar rinse solution does not react with a PR film, an excessive development does not occur even if the nonpolar rinse solution remains on the substrate W.

The substrate W may be transferred from the first processing chamber PC1 to the second processing chamber PC2, having the nonpolar rinse solution remained thereon (i.e., being in a wet state), not to be dried up while being transferred. If the substrate W is transferred in its dry state, defects may easily occur on the substrate W due to any foreign materials, or the PR film on the substrate W may easily be damaged (or crumble).

If the step of substituting the organic developing solution with the nonpolar rinse solution, i.e., S120, is not performed, the substrate W with the organic developing solution remained thereon may be transferred from the first processing chamber PC1 to the second processing chamber PC2. In this case, the organic developing solution may continue to react with the PR film on the substrate W. As a result, as the PR film on the substrate W is excessively developed, desired target patterns may not be able to be properly formed, and the collapse of the PR film on the substrate W, i.e., a PR leaning phenomenon, may occur. Also, due to the heaviness of the PR film as a polymer, PR residues that may be generated during the development of the PR film may remain between patterns and may cause defects.

However, according to the embodiment of FIG. 5, as the organic developing solution is substituted with the nonpolar rinse solution, the PR film on the substrate W can be prevented from being excessively developed, and target patterns can be precisely formed.

Thereafter, the substrate W is dried with a supercritical fluid, in the second processing chamber PC2 (S140). That is, the nonpolar rinse solution is removed with the supercritical fluid.

Specifically, as the supercritical fluid (e.g., carbon dioxide in a supercritical state) has a high permeability, the supercritical fluid can effectively remove the nonpolar rinse solution that may remain between patterns.

The nonpolar rinse solution will hereinafter be described with reference to FIGS. 1, 5, 6, and 7.

Figure 6:
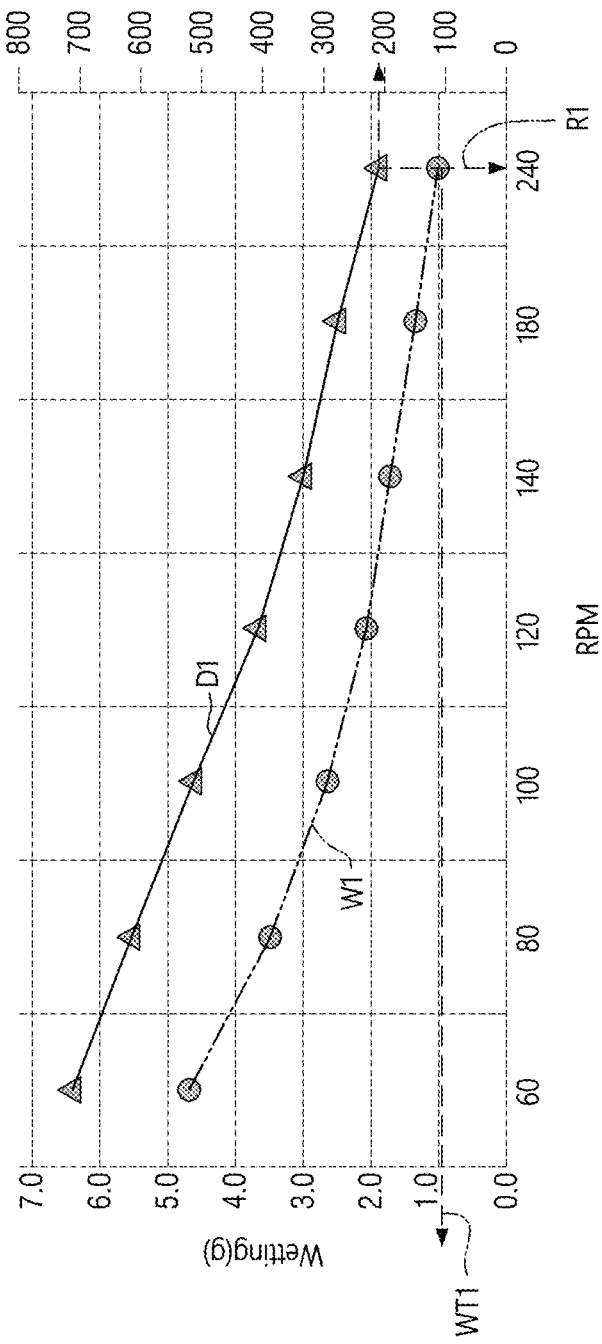
FIG. 6 is a graph showing the wetting volume and the liquid film-holding time of decane versus the rotation speed of a substrate (in revolutions per minute (rpm))
Figure 7:
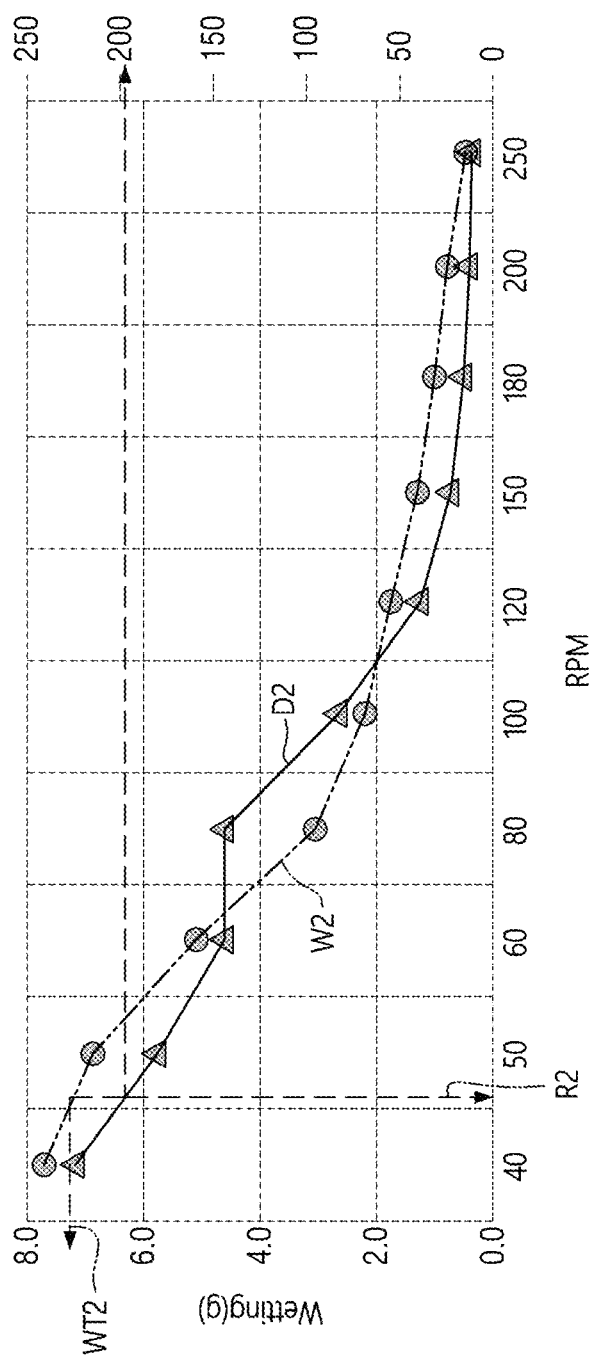
FIG. 7 is a graph showing the wetting volume and the liquid film-holding time of n-butyl acetate versus the rotation speed of a substrate (in rpm)

FIG. 6 is a graph showing the wetting volume and the liquid film-holding time of decane versus the rotation of a substrate (in rpm). FIG. 7 is a graph showing the wetting volume and the liquid film-holding time of n-butyl acetate versus the rotation of a substrate (in rpm).

Referring to FIG. 6, an x axis represents the rotation speed of the substrate W (in rpm), and a y axis represents wetting volume (in g) and liquid film-holding time (in sec).

D1 is a curve showing the drying time of decane, and W1 is a curve showing the wetting volume of decane.

For example, it is assumed that a liquid film-holding time of about 200 sec is required. As already mentioned above, the transfer robot of the transfer chamber 2200 retrieves the substrate W from the first processing chamber PC1, moves from the first processing chamber PC1 to the second processing chamber PC2, and injects the substrate W into the second processing chamber PC2. The substrate W needs to be maintained to be wet until being processed with the supercritical fluid. That is, a liquid fluid needs to be maintained on the substrate W. The term "liquid film-holding time" may refer to the amount of time that it takes to process the substrate W with the supercritical fluid, in the second processing chamber PC2, after the transfer robot of the transfer chamber 2200 brings the substrate W out of the first processing chamber PC1.

According to the curve D1, a rotation speed R1 of the substrate W for achieving a liquid film-holding time of about 200 sec is about 240 rpm.

According to the curve W1, when the rotation speed R1 is about 240 rpm, a wetting volume WT1 of decane is about 1 g.

In short, referring to FIG. 6, if decane is supplied onto the substrate W while rotating the substrate W at about 240 rpm, a liquid film of about 1 g of decane is maintained on the substrate W for about 200 sec.

Referring to FIG. 7, an x axis represents the rotation speed of the substrate W (in rpm), and a y axis represents wetting volume (in g) and liquid film-holding time (in sec).

D2 is a curve showing the drying time of n-butyl acetate, and W2 is a curve showing the wetting volume of n-butyl acetate.

According to the curve D2, a rotation speed R2 of the substrate W for achieving a liquid film-holding time of about 200 sec is about 45 rpm.

According to the curve W2, when the rotation speed R2 is about 45 rpm, a wetting volume WT2 of n-butyl acetate is about 7 g.

In short, referring to FIG. 7, if n-butyl acetate is supplied onto the substrate W while rotating the substrate W at about 45 rpm, a liquid film of about 7 g of n-butyl acetate is maintained on the substrate W for about 200 sec.

Referring to FIGS. 6 and 7, only about 1 g of decane, which can be used as a nonpolar rinse solution, can achieve a liquid film-holding time of about 200 sec. That is, only a small amount of decane can achieve a liquid film-holding time of about 200 sec, as compared to n-butyl acetate, and the amount of decane that needs to be removed with a supercritical fluid is very small. Thus, the amount of time that it takes to process the substrate with the supercritical fluid can be reduced.

Decane has a lower vapor pressure and/or a higher viscosity than n-butyl acetate. Specifically, the vapor pressure of n-butyl acetate is 1.413 KPa, whereas the vapor pressure of decane is 0.199 KPa. The viscosity of n-butyl acetate is 0.69 cP, whereas the viscosity of decane is 0.92 cP. As decane has a relatively low vapor pressure and/or a relatively high viscosity, decane is dried slower than n-butyl acetate and may thus be more suitable than n-butyl acetate for holding a liquid film.

There are alkane solvents having similar properties to decane, such as nonane, undecane, and dodecane. For example, dodecane has a vapor pressure of 0.018 KPa and a viscosity of 1.34 cP. Thus, at least one of nonane, undecane, and dodecane may be used, instead of decane.

Alkane solvents such as nonane, decane, undecane, and dodecane have a symmetrical molecular structure and are thus easily extractable by nonpolar supercritical carbon dioxide.

Also, alkane solvents are easily mixed with an organic developing solution. Thus, an organic developing solution can be easily substituted with a nonpolar rinse solution.

Accordingly, at least one of nonane, decane, undecane, and dodecane may be used as a nonpolar rinse solution that can substitute for an organic developing solution.

S110 and S120 will hereinafter be described with reference to FIGS. 8 through 10.

Figure 8:
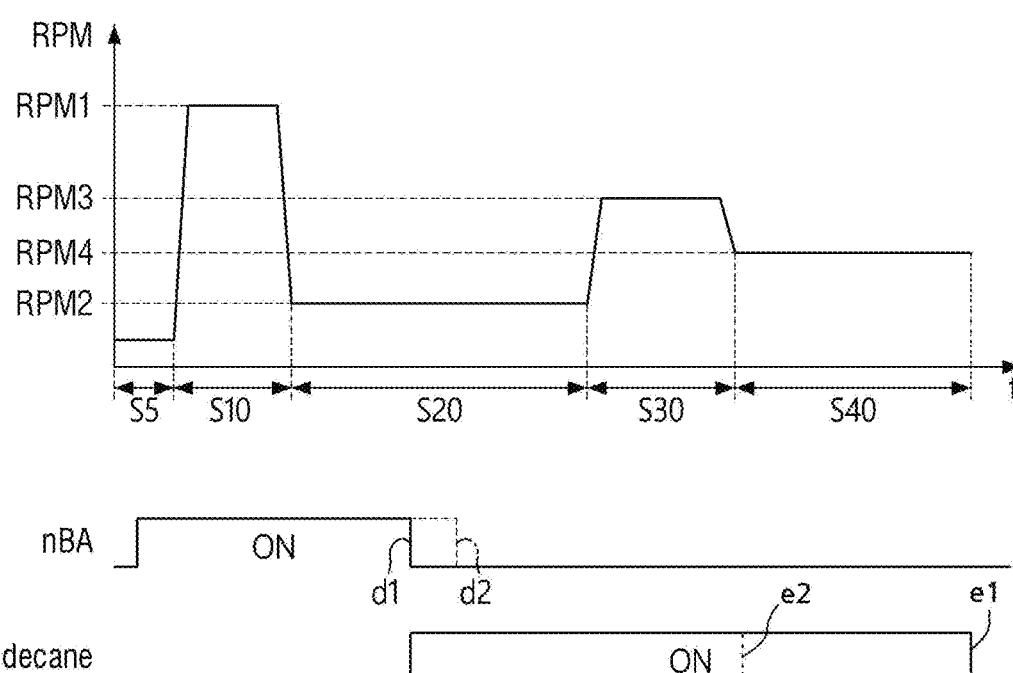
FIG. 8 illustrates how to process a substrate according to an embodiment of the present disclosure.

FIG. 8 illustrates how to process a substrate according to an embodiment of the present disclosure.

Referring to FIG. 8, the organic developing solution is supplied onto the substrate W while rotating the substrate W at a relatively low rpm (for example, 10 rpm) (S5). S5 may be continued for about 1 sec to 2 sec.

As already mentioned above, the substrate W may have a negative PR film applied thereon and exposed to light. The organic developing solution, which is for developing the negative PR film, may be, for example, n-butyl acetate.

Thereafter, the organic developing solution is supplied while rotating the substrate W at a first rpm "RPM1" (S10).

Specifically, the first rpm "RPM1" may be, for example, 1000 rpm to 1500 rpm, and S10 may be continued for about 3 sec to 4 sec. By rotating the substrate W at high speed, the organic developing solution may be spread on the entire surface of the substrate W. In S10, the organic developing solution may be in contact with the negative PR film so that the development of the negative PR film may be performed.

Thereafter, the organic developing solution is substituted with the nonpolar rinse solution (S20) by supplying the nonpolar rinse solution onto the substrate W while rotating the substrate W at a second rpm "RPM2", which is lower than the first rpm "RPM1".

Specifically, the second rpm "RPM2" may be, for example, 50 rpm to 150 rpm, and S20 may be continued for about 10 sec.

Not only in S5 and part of S10 where the substrate W is rotated at the first rpm "RPM1", but also in part of S10 where the substrate W is rotated at the second rpm "RPM2", the organic developing solution may also be supplied onto the substrate W The supply of the organic developing solution may be terminated, and at the same time, the supply of the nonpolar rinse solution may begin. As indicated by "d1", the supply of the organic developing solution may be terminated, and at the same time, the supply of the nonpolar rinse solution may begin. Alternatively, as indicated by "d2", the termination of the supply of the organic developing solution and the beginning of the supply of the nonpolar rinse solution may overlap with each other.

As the second rpm "RPM2" is lower than the first rpm "RPM1" or a third rpm "RPM3", the nonpolar rinse solution may be well mixed with the organic developing solution. If the nonpolar rinse solution is supplied while the substrate W is being rotated at high speed, the nonpolar rinse solution may bounce on the surface of the substrate W and may thus not be able to be properly mixed with the organic developing solution.

To sufficiently substitute the organic developing solution with the nonpolar rinse solution, S20 may be continued sufficiently longer than other steps such as, for example, S10 and S30.

Thereafter, the nonpolar rinse solution is supplied while rotating the substrate W at the third rpm "RPM3", which is higher than the second rpm "RPM2" (S30).

Specifically, the third rpm "RPM3" may be, for example, 500 rpm to 600 rpm, and S30 may be continued for, for example, 5 sec to 6 sec. The rotation of the substrate W at the third rpm "RPM3" may be continued shorter than the rotation of the substrate W at the second rpm "RPM2". The substrate W is rotated faster in S30 than in S20 to remove any PR reactants from the reaction with the organic developing solution.

Thereafter, the substrate W is rotated at a fourth rpm "RPM4", which is between the second rpm "RPM2" and the third rpm "RPM3" (S40).

Specifically, the fourth rpm "RPM4" may be, for example, 150 rpm to 300 rpm, and S30 may be continued for, for example, 7 sec to 8 sec. S40 may be continued longer than S30. S40 is a step for forming a liquid film of the nonpolar rinse solution (i.e., decane) on the substrate W. For example, as already described above with reference to FIG. 6, a liquid film of about 1 g of decane may be formed by rotating the substrate W at about 240 rpm. The fourth rpm "RPM4", which is the rotation speed for forming a liquid film, may be lower than the third rpm "RPM3", which is the rotation speed for removing PR reactants.

As indicated by "e1", the supply of the nonpolar rinse solution (i.e., decane) may be continued while the substrate W is being rotated at the fourth rpm "RPM4", in which case, the wetting volume of the substrate W with the nonpolar rinse solution can be raised. As indicated by "e2", the supply of the nonpolar rinse solution (i.e., decane) may be stopped when the substrate W is being rotated at the fourth rpm "RPM4", in which case, the wetting volume of the substrate W with the nonpolar rinse solution can be lowered. That is, a determination may be made as to whether to supply the nonpolar rinse solution during the rotation of the substrate W at the fourth rpm "RPM4" based on how much to control the wetting volume of the substrate W with the nonpolar rinse solution.

Alternatively, at an early phase of S40, the nonpolar rinse solution may be supplied while rotating the substrate W at the fourth rpm "RPM4", and at a later phase of S40, the supply of the nonpolar rinse solution may be terminated, and the substrate W may be rotated at the fourth rpm "RPM4".

Figure 9:
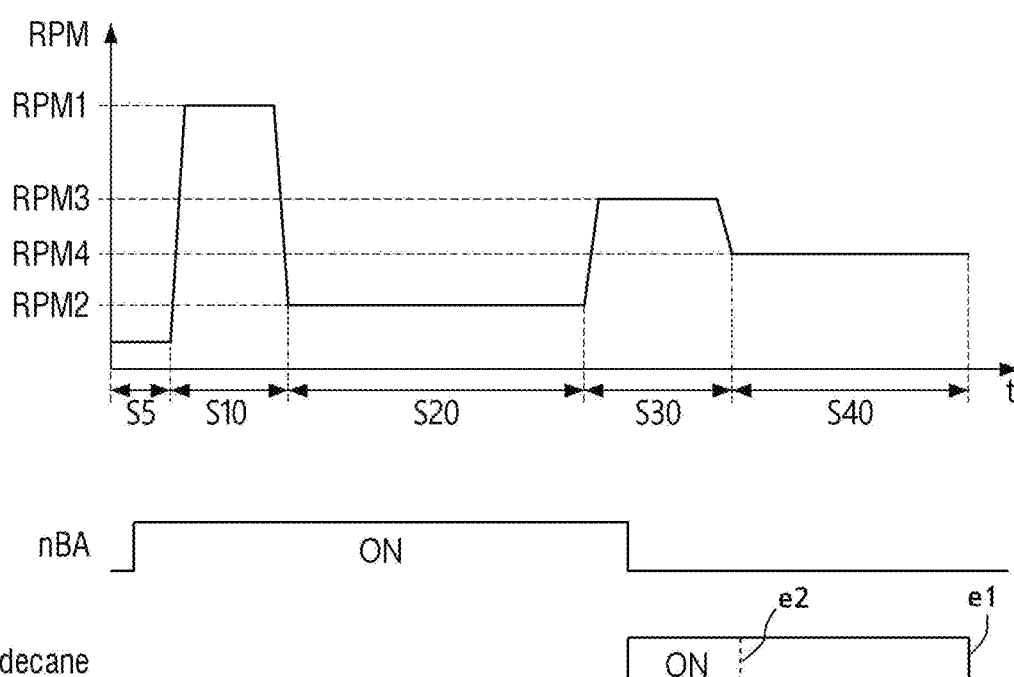
FIG. 9 illustrates how to process a substrate according to another embodiment of the present disclosure.

FIG. 9 illustrates how to process a substrate according to another embodiment of the present disclosure. For convenience, the embodiment of FIG. 9 will hereinafter be described, focusing mainly with the differences with the embodiment of FIG. 8.

In the embodiment of FIG. 8, the organic developing solution is substituted with the nonpolar rinse solution while rotating the substrate W at the second rpm "RPM2" (S20). On the contrary, in the embodiment of FIG. 9, the organic developing solution is substituted with the nonpolar rinse solution while rotating the substrate W at the third rpm "RPM3" (S30).

The substitution of the organic developing solution with the nonpolar rinse agent may be less sufficient when performed in S30 than when performed in S20. However, as a development process from S10 is continued even in S20, a sufficient development time can be secured.

As already mentioned above, the supply of the nonpolar rinse solution (e.g., decane) may be terminated in S40 or may be continued throughout S40 or only in part of S40.

Figure 10:
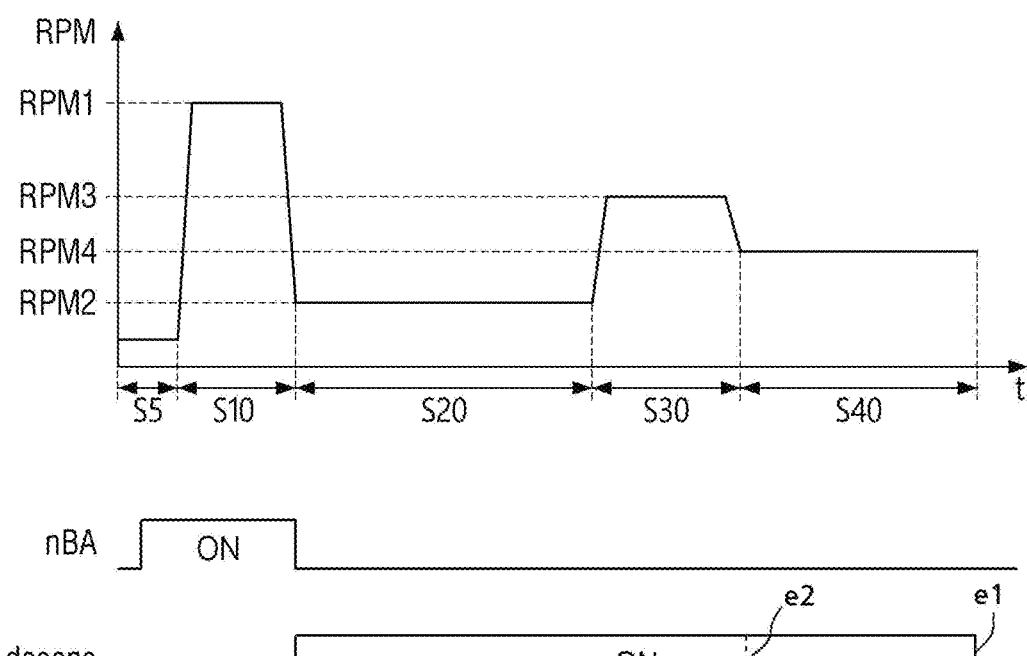
FIG. 10 illustrates how to process a substrate according to another embodiment of the present disclosure.

FIG. 10 illustrates how to process a substrate according to another embodiment of the present disclosure. For convenience, the embodiment of FIG. 10 will hereinafter be described, focusing mainly with the differences with the embodiments of FIGS. 8 and 9.

In the embodiment of FIG. 8, the organic developing solution is substituted with the nonpolar rinse solution while rotating the substrate W at the second rpm "RPM2" (S20). On the contrary, in the embodiment of FIG. 10, the organic developing solution is supplied only in S10, and at the beginning of S20, the supply of the organic developing solution is terminated, and the supply of the nonpolar rinse solution begins (S30).

As already mentioned above, the supply of the nonpolar rinse solution (e.g., decane) may be terminated in S40 or may be continued throughout S40 or only in part of S40.

The substitution of the organic developing solution with the nonpolar rinse solution (as performed in FIGS. 5 and 8 through 10) and the non-substitution of the organic developing solution with the nonpolar rinse solution may both be employed at the same time, and this will hereinafter be described with reference to FIG. 1.

Referring to FIG. 1, a first substrate is developed with an organic developing solution, in the first processing chamber PC1, by supplying the organic developing solution onto the first substrate. The first substrate is processed with a supercritical fluid, in the second processing chamber PC2. The transfer robot of the transfer chamber 2200 transfers the first substrate with the organic developing solution remained thereon from the first processing chamber PC1 to the second processing chamber PC2. Here, the organic developing solution may be, for example, n-butyl acetate.

On the contrary, an organic developing solution is supplied onto a second substrate, in a third processing chamber PC3, and the organic developing solution on the second substrate is substituted with a nonpolar rinse solution, as described above with reference to FIGS. 5 and 8 through 10. The second substrate is processed with the supercritical fluid, in a fourth processing chamber PC4. The transfer robot of the transfer chamber 2200 transfers the second substrate with the nonpolar rinse solution remained thereon from the third processing chamber PC3 to the fourth processing chamber PC4. Here, the organic developing solution may be, for example, n-butyl acetate, and the nonpolar rinse solution may be, for example, decane.

As already described above with reference to FIGS. 6 and 7, the wetting volumes of n-butyl acetate and decane for achieving a predetermined liquid film-holding time (of, for example, 200 sec) may be about 7 g and about 1 g, respectively.

Thus, a first amount of the organic developing solution remained on the first substrate during the transfer of the first substrate from the first processing chamber PC1 to the second processing chamber PC2 may be greater than a second amount of the nonpolar rinse solution remained on the second substrate during the transfer of the second substrate from the third processing chamber PC3 to the fourth processing chamber PC4.

A step of forming a first liquid film to leave the organic developing solution on the first substrate by as much as the first amount includes rotating the first substrate at a first rpm for a first period of time. A step of forming a second liquid film to leave the nonpolar rinse solution on the second substrate by as much as the second amount includes rotating the second substrate at a second rpm for a second period of time.

As already described above with reference to FIGS. 6 and 7, to achieve a liquid film-holding period of, for example, 200 sec, the first substrate may be rotated at about 45 rpm, in the first processing chamber PC1, and the second substrate may be rotated at about 240 rpm, in the third processing chamber CP3.

Accordingly, the first rpm during the formation of the first liquid film may be lower than the second rpm during the formation of the second liquid film. The organic developing solution has been described so far as being substituted with the nonpolar rinse solution, but the present disclosure is not limited thereto. That is, any type of rinse solution may be used as long as it can suppress any unnecessary additional reaction between the organic developing solution and a PR film.

Although the present disclosure has been described above in relation to the above-mentioned exemplary embodiments thereof, the present disclosure may be modified or changed in various ways without departing from the gist and scope of the disclosure. Therefore, such modifications or changes belong to the scope of the attached claims as long as the modifications or changes belong to the gist of the present disclosure.

What is claimed is:

1. A method of processing a substrate, comprising:
supplying an organic developing solution onto a substrate while rotating the substrate at a first revolutions per minute (rpm) over a first period of time;
substituting the organic developing solution with a non-polar rinse solution by starting a supplying of the nonpolar rinse solution onto the substrate while rotating the substrate at a second rpm that is lower than the first rpm over a second period of time following the first period of time;
continuing to supply the nonpolar rinse solution while rotating the substrate at a third rpm that is higher than the second rpm; and
rotating, after rotating the substrate at the third rpm, the substrate at a fourth rpm that is between the second rpm and the third rpm,
wherein the organic developing solution is continued to be supplied onto the substrate for a portion of the second period of time and stopped when the nonpolar rinse solution is starting to be supplied onto the substrate during the second period of time.

2. The method of claim 1, wherein
the substrate is provided in a state of having a negative photoresist (PR) film applied thereon and exposed to light, and
the organic developing solution is n-butyl acetate.

3. The method of claim 2, wherein a vapor pressure of the nonpolar rinse solution is lower than a vapor pressure of the organic developing solution.

4. The method of claim 2, wherein a viscosity of the nonpolar rinse solution is higher than a viscosity of the organic developing solution.

5. The method of claim 1, wherein the nonpolar rinse solution includes at least one of nonane, decane, undecane, and dodecane.

6. The method of claim 1, wherein the second period of time over which the substrate is rotated at the second rpm is longer than the third period of time over which the substrate is rotated at the third rpm.

7. The method of claim 1, wherein a first nozzle for supplying the organic developing solution and a second nozzle for supplying the nonpolar rinse solution are installed within a single arm of a single nozzle structure.

8. The method of claim 1, further comprising:
transferring the substrate with the nonpolar rinse solution remained thereon to a processing chamber for processing the substrate with a supercritical fluid.

9. A method of processing a substrate, comprising:
a first step of supplying an organic developing solution onto a substrate with an exposed photoresist (PR) film formed thereon, while rotating the substrate at a first revolutions per minute (rpm) over a first period of time;
a second step of reducing a rotation speed of the substrate from the first rpm to a second rpm that is lower than the first rpm over a second period of time following the first period of time; and
a third step of removing PR reactants, generated from a reaction of the PR film with the organic developing solution, by raising the rotation speed of the substrate from the second rpm to a third rpm that is higher than the second rpm and lower than the first rpm,
wherein the organic developing solution is substituted with a rinse solution during the second step or during the third step by stopping the supplying of the organic developing solution while starting a supplying of the rinse solution onto the substrate during the second step or during the third step,
wherein the organic developing solution is continued to be supplied onto the substrate for a portion of the second period of time and stopped when the rinse solution is starting to be supplied onto the substrate during the second period of time.

10. The method of claim 9, wherein
the substrate is provided in a state of having a negative PR film applied thereon and exposed to light, and
the organic developing solution is n-butyl acetate.

11. The method of claim 1, wherein the first rpm being at least 1000 rpm.

* * * * *